United States Patent [19]

Bell et al.

[11] 4,407,005
[45] * Sep. 27, 1983

[54] N-CHANNEL JFET DEVICE HAVING A BURIED CHANNEL REGION, AND METHOD FOR MAKING SAME

[75] Inventors: Kenneth M. Bell, Princeton; Joe R. Trogolo, Plano, both of Tex.

[73] Assignee: Texas Instruments Incorporated, Dallas, Tex.

[*] Notice: The portion of the term of this patent subsequent to Mar. 30, 1999 has been disclaimed.

[21] Appl. No.: 308,699

[22] Filed: Oct. 5, 1981

Related U.S. Application Data

[62] Division of Ser. No. 113,853, Jan. 21, 1980.

[51] Int. Cl.³ ............................................. H01L 29/18
[52] U.S. Cl. ......................................... 357/23; 357/41
[58] Field of Search ............................. 357/22, 23, 41

[56] References Cited

U.S. PATENT DOCUMENTS 4,314,267 2/1982 Bergeron et al. ................. 357/22 X
4,322,738 3/1982 Bell ....................................... 357/41

Primary Examiner—Martin H. Edlow
Attorney, Agent, or Firm—Douglas A. Lashmit; Melvin Sharp; N. Rhys Merrett

[57] ABSTRACT

A buried n-channel junction field-effect transistor (JFET) fabricated in standard bipolar integrated circuit starting material. The transistor has a deep p-well as the bottom gate formed in an n-type body. The source is surrounded by the p-well while the drain is the epitaxial layer near the surface of the body outside the p-well. A buried channel connects the source and drain. A p-layer above the buried channel forms the top gate. Gate leakage current and noise are very low.

2 Claims, 4 Drawing Figures

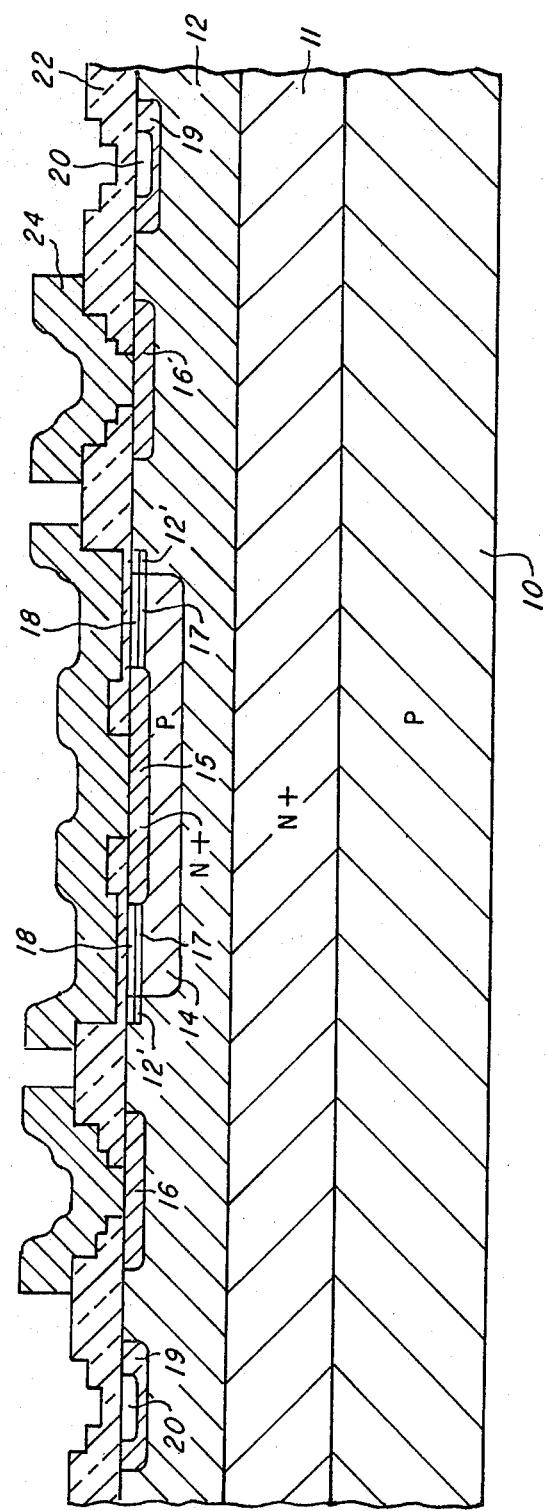

N-CHANNEL JFET DEVICE HAVING A BURIED CHANNEL REGION, AND METHOD FOR MAKING SAME

This is a division, of application Ser. No. 113,853, filed Jan. 21, 1980.

BACKGROUND OF THE INVENTION

This invention is directed to semiconductor field-effect transistors, and more particularly, to an n-channel junction field-effect transistor.

The junction field-effect transistor has several characteristics which make it a desirable circuit element in many linear applications. It has extremely high input impedance (and consequently, low input current) and very low noise. Because of these characteristics, the junction field-effect transistors are being used in the input stage of operational amplifiers and comparators. In both types of circuits, it is desirable to have low input currents and low noise. When the gate of the JFET is the input of the amplifier or comparator, very low circuit input currents are achieved (at least at room temperature). The first JFETs used in integrated circuit operational amplifiers and comparators were p-channel devices because initially they were the easiest to integrate along with bipolar circuit elements. However, because of their operating requirements it was not possible to take the inputs of the p-channel JFET input circuits to ground when the circuits were operated from a single power supply. This restricted the common mode range of the circuits.

SUMMARY OF THE INVENTION

A buried n-channel junction field-effect transistor is fabricated in standard bipolar integrated circuit starting material comprising a substrate, buried layer and epitaxial layer (body). The transistor has a deep p-type region as the bottom gate which is formed in the n-type epitaxial layer. The source region is formed in a surface region of the body and is surrounded by the deep p-type region. A heavily doped n-type region is formed in the epitaxial layer and is used to facilitate contact to the drain region. The drain is part of the epitaxial layer near the surface adjacent the p-type region and between the deep p-type region and the heavily doped n-type region. A shallow n-type region connects the source and drain to form the buried channel. A shallow p-type region is formed above the buried channel and acts as the top gate.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings wherein:

FIGS. 2a-2c are cross-sectional views of the transistors of FIG. 1, taken along the lines a—a, b—b and c—c respectively.

DETAILED DESCRIPTION OF THE DRAWINGS

Figure 1:
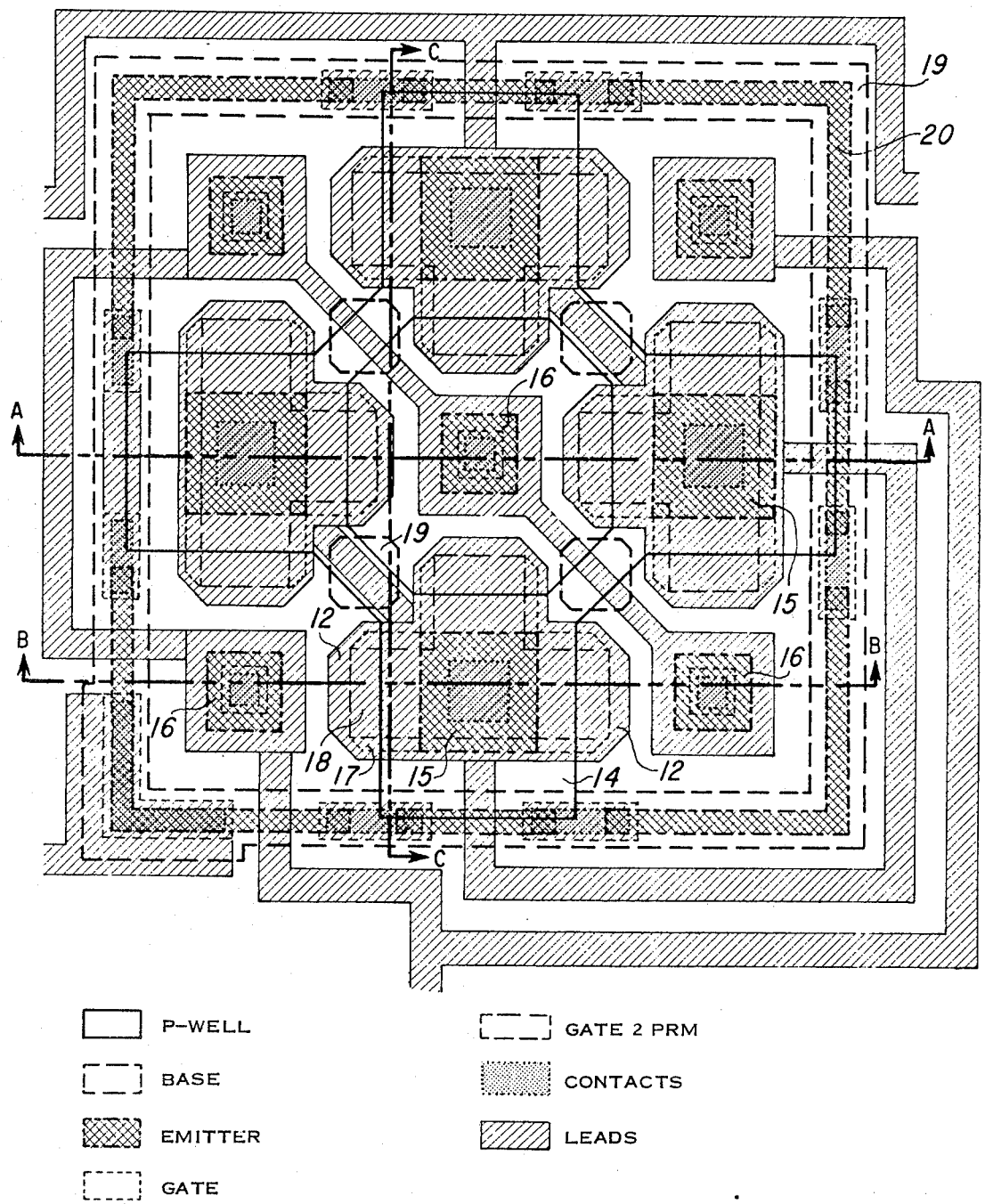
FIG. 1 is a greatly enlarged plan view of a small portion of a semiconductor chip showing the physical layout of a group of JFET transistors formed in an orthogonal structure and interconnected in such a manner so as to act as one large transistor.

Referring to FIGS. 1 and 2a-2c, a group of n-channel JFET transistors formed in an orthogonal structure and interconnected in such a manner so as to act as one large transistor is shown. Although a group of transistors has been shown in the drawings, the invention is fully demonstrated by a single transistor. The transistor is formed in a n-type monocrystalline silicon body 12 which is the epitaxial layer 12 of standard bipolar integrated circuit starting material. The epitaxial layer 12 lies upon a p-type monocrystalline silicon substrate 10 having a heavily doped n-type buried layer 11. A first doped region 14 of p-type silicon lies in a surface of the silicon body and forms the bottom gate 14 of the transistor. A second doped region 15 of n-type silicon lies in said surface of the body 12 and is surrounded by the first doped region 14. The second doped region 15 forms a source 15 of the transistor. A third doped region 16 of heavily n-type silicon lies in said surface completely outside the first doped region 14, and facilitates contact to the drain 12'. The drain 12' of the transistor is part of the body 12 near said surface adjacent the first doped region 14 and between the first doped region 14 and the third doped region 16. A fourth doped region 17 of n-type silicon lies wholly below said surface between second and third doped regions 15, 16, respectively. The fourth doped region 17 is in contact with the second doped region 15 and extends laterally partially outside the first doped region 14 to form the buried channel 17 of the transistor. A fifth doped region 18 of p-type silicon lies in said surface above and in contact with fourth doped region 17 and in contact with the second doped region 15. The fifth doped region 18 extends laterally between source 15 and drain 12' the same distance as the fourth doped region 17, but overlaps the fourth doped region 17 in the perpendicular direction. The fifth doped region 18 forms the top gate 18 of the transistor. A sixth doped region 19 of p-type silicon lies in said surface in contact with the first doped region 14. The sixth doped region 19 facilitates contact to and acts as a guard ring for the first doped region 14. A seventh doped region 20 of heavily n-type silicon lies in said surface surrounded by said sixth doped region 19. The seventh doped region 20 is electrically shorted to the sixth doped region 19 and acts to reduce the gate resistance of the orthogonal transistor structure. An insulating layer 22 of silicon dioxide lies upon said surface and has apertures for contact to second, third, sixth and seventh doped regions 15, 16, 19, 20, respectively. Conductive layers 24 of aluminum lie upon the insulating layer 22 covering the apertures. In the preferred embodiment, the conductive layer 24 covering the aperture above the second doped layer 15 extends across the insulating layer 22 so as to totally overlap the fifth doped region 18.

Figure 2A:
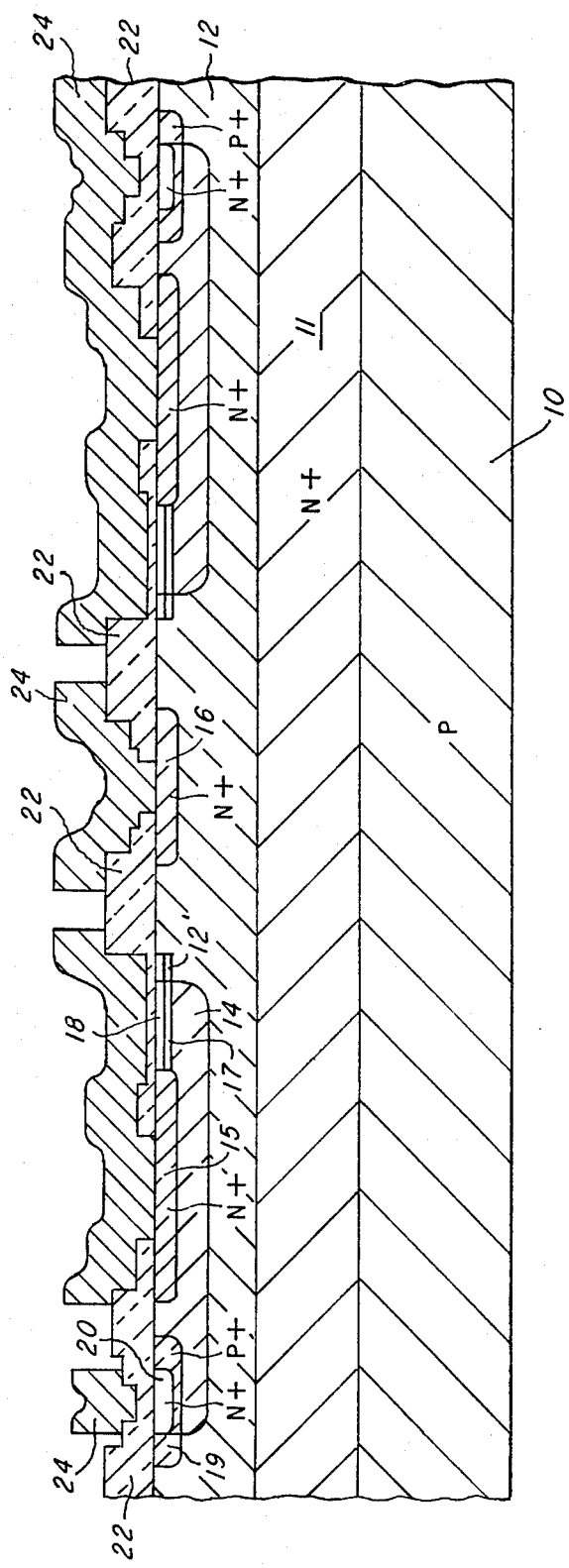
Figure 2C:
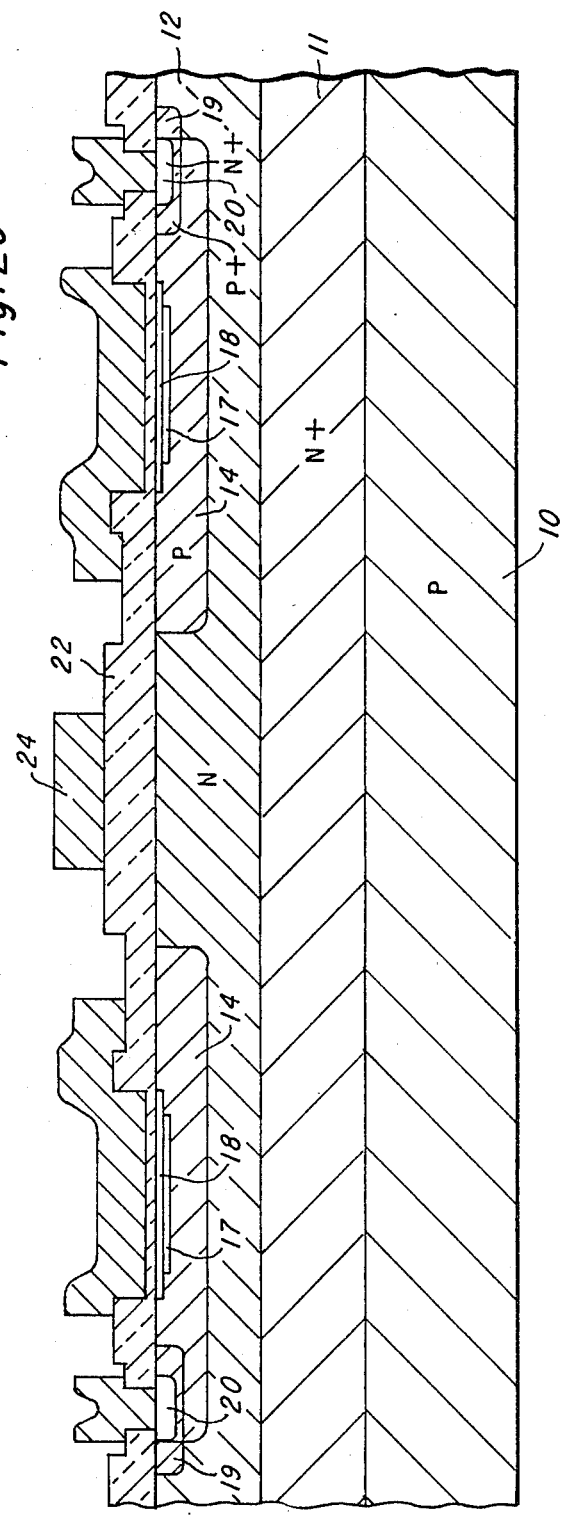

Referring to FIGS. 2a-2c, a process for making the transistors of FIGS. 1 and 2a-2c is described. A starting slice is a p-type monocrystalline silicon substrate 10 of 10-20 ohm-cm cut on the <111> orientation. The substrate 10 is oxidized and patterned with oxide being removed where the buried layer 11 is desired. A spin-on arsenic source is applied and the slice annealed at high temperatures to cause arsenic to diffuse into the substrate 10. The spin-on source is removed and the slice is subjected to an oxidizing ambient in a high temperature furnace tube to cause the arsenic to further diffuse into the substrate 10 and form the buried layer region 11.

The buried layer region 11 has a resistance of 10–30 ohm/square, preferably 15–20 ohms/square, and a junction depth of 10–20 microns, preferably 14–17 microns. The oxide on the slice is then completely removed and the slice is placed in an epitaxial reactor where an arsenic doped epitaxial layer (body) 12 is grown upon the slice. The epitaxial layer 12 has a thickness of 3–20 microns, preferably 12–15 microns, and a resistivity of 0.3–10 ohm-cm, preferably 5–8 ohm-cm. At this point in the process, the slice has the characteristics of standard bipolar integrated circuit (Inf and Epi) starting materials.

After epitaxial layer growth, the slice is placed in a high temperature steam ambient to grow an oxide layer 22 of about 7000 A thickness. As processing continues, this layer 22 will increase and decrease in thickness and some areas will have different thicknesses than others. However, all parts of this layer will be referred to as an insulating layer 22 and will be labeled with the same reference numeral 22. The oxide layer 22 is then patterned using conventional photolithographic techniques with oxide being removed where the isolation regions are desired. Note that the isolation regions are not shown in any of the FIGURES. The slice is then subjected to a boron "deposition" step where the boron is "deposited" in surface areas of the epitaxial layer 12. After the boron glass is removed, the slice is placed in a high temperature furnace tube to diffuse the "deposited" boron through the epitaxial layer 12 until it reaches the substrate 10. During the isolation diffusion more oxide is grown upon the slice.

The next steps in the process begin the formation of the JFET transistor. The oxide layer 22 is patterned using conventional photolithographic techniques with oxide being removed from areas where the p-well (first doped region) 14 is desired. The slice is oxidized in a high temperature oxygen ambient to grow a 1000 A oxide layer over the areas where the p-well 14 is desired. Then the slice is subjected to a boron implant at a dose of $10^{12}$–$10^{14}$ ions/cm$^2$ at 50–200 KeV, preferably $1\times 10^{13}$ ion/cm$^2$ at 110 KeV, followed by a high temperature diffusion to form the p-well. The p-well has a resistance of 1000–7000 ohms/square, preferably 3500 ohms/square, and a junction depth of 2–8 microns, preferably 5 microns. During the p-well 12 diffusion step further oxide is grown upon the slice.

After the formation of the p-well 12, the oxide layer 22 is again patterned using conventional photolithographic techniques with oxide being removed where the p+ region (sixth doped regions) 19 are desired. Well known techniques are then used to "deposit" boron impurities in shallow surface areas of the slice where the oxide is removed. After removal of the boron glass formed at the "deposition step", the slice is placed in a high temperature tube to further diffuse the boron impurities into the slice to form the p+ regions (sixth doped regions) 19. The p+ regions 19 have a resistance of 100–250 ohm/square, preferably 160 ohm/square, and a junction depth of 1–4 microns, preferably 3 microns. During the diffusion step to form the p+ regions 19, additional oxide is formed upon the slice. Note that on other parts of the slice not shown in the FIGURES, the p+ regions 19 would be used to form conventional bipolar transistor base regions.

Next, the oxide layer 22 is patterned using conventional photolithographic techniques with oxide being removed from areas where the sources (second doped regions) 15, n+ drain contact regions (third doped regions) 6, and seventh doped regions 20 are desired. Then the slice is placed in a high temperature furnace tube where phosphorus is diffused in to the slice in the areas where the oxide is removed. During this high temperature step, additional oxide is formed upon the slice. The n+ regions 15, 16, 20 have a resistance of 2–10 ohms/square, preferably 4 ohm/square, and a junction depth of 1–4 microns, preferably 2.5 microns. Note that on other parts of the slice not shown in the FIGURES, the n+ regions 15, 16, 20 would be used to form conventional bipolar transistor emitter regions.

After the formation of the n+ regions 15, 16, 20, the oxide layer 22 is patterned using conventional photolithographic techniques with oxide being removed where the top gate (fifth doped region) 18 is desired. The slice is then oxidized in a steam ambient to form a 1100 A oxide layer above the areas where the fifth doped region 18 is to be formed. The slice is then placed in a high temperature furnace tube where a small amount of $P_2O_5$ is deposited upon the slice to stabilize the oxide layer 22. Then the slice is subjected to a boron implant at a dose of $10^{12}$–$10^{13}$ ions/cm$^2$ at 30–80 KeV, preferably $4.0\times 10^{12}$ ion/cm$^2$ at 50 KeV. A layer of photoresist is then applied and patterned with photoresist being removed where the buried channel (fourth doped region) 17 is desired. The slice is then subjected to a phosphorus implant at a dose of $1$–$5\times 10^{12}$ ion/cm$^2$ at 200–400 KeV, preferably $2.5\times 10^{12}$ ion/cm$^2$ at 340 KeV. The photoresist is then removed and the slice annealed in a high temperature at furnace tube to activate the implanted boron and phosphorus impurities, thereby forming the fourth and fifth doped regions 17, 18, respectively.

The apertures in the oxide layer 22 used for device contacts are formed next by conventional photolithographic techniques. Then the slice is placed in an e-beam metal evaporator where a layer 24 comprising aluminum is deposited upon the slice to a thickness of 8000–20,000 Å, preferably 15,000 Å. The aluminum layer 24 is patterned using conventional photolithographic techniques leaving aluminum 24 remaining for device interconnects. The slice is then annealed in an inert ambient, thereby completing the process.

Although a specific device and process have been described it is not intended that the invention be so limited. The JFET structure can be fabricated so as to operate at very low voltages or at much higher voltages than are contemplated by the disclosed processing parameters. Therefore, the junction depth, layer thicknesses, impurity concentrations, etc. could be much higher or much lower than those disclosed depending on the desired use of the JFET.

The resulting n-channel JFET has several advantages, especially when integrated with existing bipolar devices and used in the input stage of an operational amplifier or comparator. The n-channel JFETS have very low gate leakage current at room temperature which is the input current to the operational amplifier or comparator. Low input current is very desirable on these circuit. Also, the circuits can be operated from a single positive voltage power supply and have the input common mode range extend to ground or slightly below ground when these JFETS are used in the inputs. This makes possible whole new families of operational amplifiers and comparitors. Additionally, the n-channel JFETS also have excellent noise and matching characteristics, especially when fabricated in the orthogonal layout of FIG. 1.

While this invention has been described with reference to illustrative embodiments, it is not intended that this description be construed in a limiting sense. Various modifications of the illustrated embodiments, as well as other embodiments of the invention, will be apparent to persons skilled in the art upon reference to this description. It is therefore contemplated that the appended claims will cover any such modifications of embodiments as fall within the true scope of the invention.

What is claimed is:

1. An N-channel junction field effect transistor comprising:
   (a) a P-type semiconductor substrate;
   (b) an N-type epitaxial layer on one surface of said substrate;
   (c) a first P-type gate region formed as a well in said N-type epitaxial region, said first P-type region comprising the bottom gate for said transistor;
   (d) a second P-type gate region formed at the surface of said substrate;
   (e) an N-type channel region buried beneath said second P-type gate region and above said first P-type region, said N-type channel region extending partially outside said first P-type region; and
   (f) an N-type source region at the surface of said epitaxial layer and surrounded by said P-type regions, said N-type channel region providing electrical communication between said N-type source region and said N-type epitaxial layer, said N-type epitaxial layer operative as a drain region.

2. A transistor as in claim 1, wherein said transistor is integrated on a monolithic semiconductor substrate with bipolar circuitry.

* * * * *